United States Patent [19]
Janzen et al.

[11] Patent Number: 6,150,815
[45] Date of Patent: Nov. 21, 2000

[54] METHOD OF CORRECTING FOR MAGNETIC FIELD INHOMOGENEITY IN MAGNETIC RESONANCE IMAGING

[75] Inventors: Dennis Lyle Janzen; Douglas George Connell; Alexander Lloyd MacKay; Qing-San Xiang, all of Vancouver, Canada

[73] Assignee: The University of British Columbia, Vancouver, Canada

[21] Appl. No.: 09/058,272

[22] Filed: Apr. 9, 1998

Related U.S. Application Data

[60] Provisional application No. 60/043,957, Mar. 17, 1997.

[51] Int. Cl.$^7$ ........................................................ G01V 3/00
[52] U.S. Cl. ............................................ 324/309; 324/307
[58] Field of Search ................................... 324/309, 307, 324/312, 318

[56] References Cited

U.S. PATENT DOCUMENTS

| | | | |
|---|---|---|---|
| 4,684,893 | 8/1987 | Kojima et al. | 324/312 |
| 5,055,789 | 10/1991 | Kondo et al. | 324/309 |
| 5,351,006 | 9/1994 | Sumanaweera et al. | 324/309 |
| 5,485,085 | 1/1996 | Sumanaweera et al. | 324/307 |

OTHER PUBLICATIONS

Cho, Z.H., et al., "Total inhomogeneity correction including chemical shifts and susceptibility by view angle tilting," *Medical Physics*, vol. 15, No. 1, Jan./Feb. 1988, pp. 7–11.

Yang, Q.X., et al., "Multi–Gradient Echo with Susceptibility Inhomogeneity Compensation at 3.0 Tesla," *Proceedings of the Third Annual Scientific Meeting of the Society of Magnetic Resonance*, Nice, France, Aug. 19–25, 1995, p. 198.

McGowan, A.J., et al., "Reduction of Image Distortion in the Presence of Metal," *Proceedings of the fifth Annual Scientific Meeting of the International Society for Magnetic Resonance in Medicine*, Vancouver, Canada, Apr. 12–18, 1997, p. 1973.

*Primary Examiner*—Christine K. Oda
*Assistant Examiner*—Tiffany A. Fetzner
*Attorney, Agent, or Firm*—Christensen O'Connor Johnson Kindness PLLC

[57] ABSTRACT

A method of correcting for magnetic field inhomogeneity caused by various factors, such as implanted metal and air/tissue interfaces, in magnetic resonance imaging (MRI) is provided. Geometric distortion due to inhomogeneity in a static magnetic field $B_0$ is corrected for by addition of a compensation gradient. The compensation gradient is applied in the slice selection direction Z, has a timing substantially identical to the standard frequency encoding gradient $G_x$, and has an amplitude identical to the slice selection gradient $G_z$ that is applied during the initial RF excitation. Inhomogeneity in an RF field $B_1$ is compensated for by utilizing an RF coil that is large enough in size as compared with a metal implant to make the volumetric percentage of the metal in the coil insignificant. Inhomogeneity in a gradient field $G=(G_x, G_y, G_z)$ is corrected for by a treatment of the most significant error factor $G_z$ that causes slice thickness error. Specifically, the method acquires two images with complementary slice thickness error by using two pulse sequences with flipped slice selection gradients $G_z$; combination of the two images successfully cancels the effect of the slice thickness error. Local dephasive MRI signal loss due to magnetic field inhomogeneity is corrected for by acquisition of two images with positive and negative offset $G_z$ gradient lobes, respectively. The pair of images are combined to cancel the effect of local signal loss error.

10 Claims, 6 Drawing Sheets

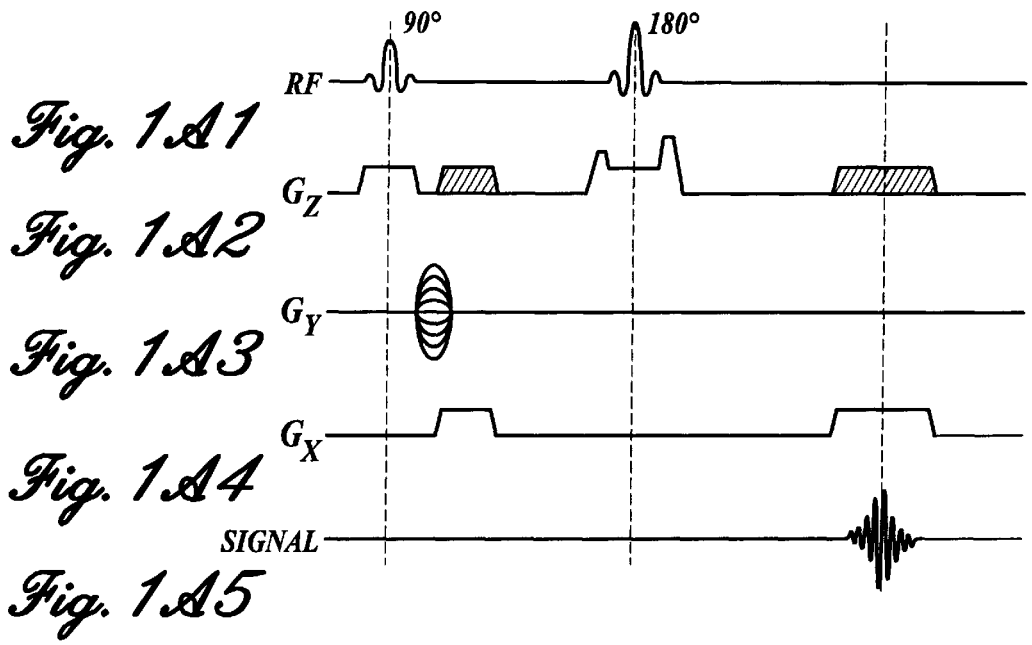
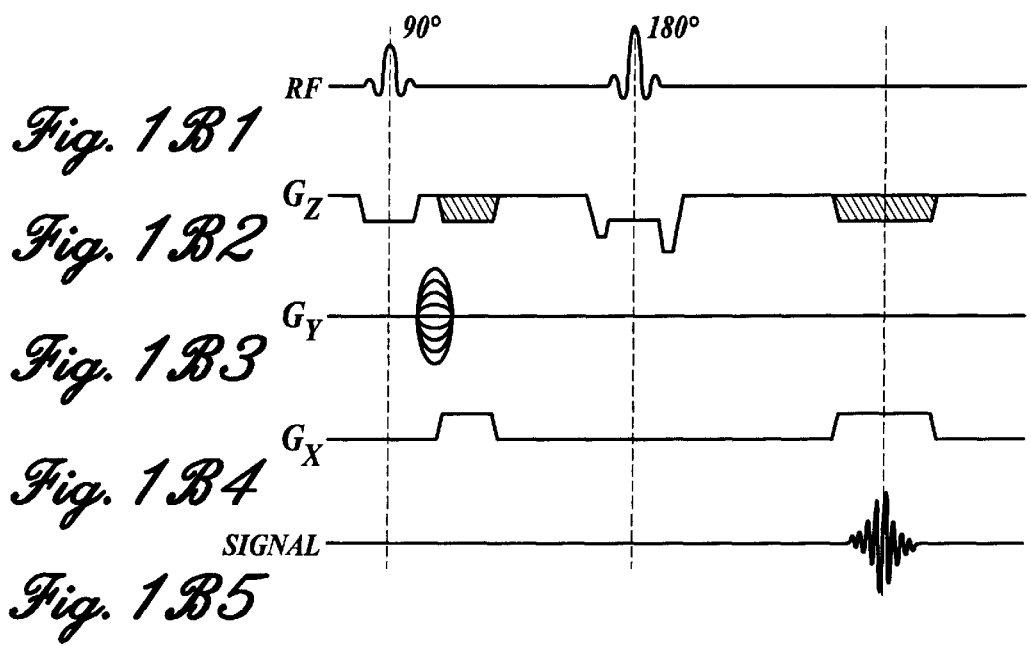

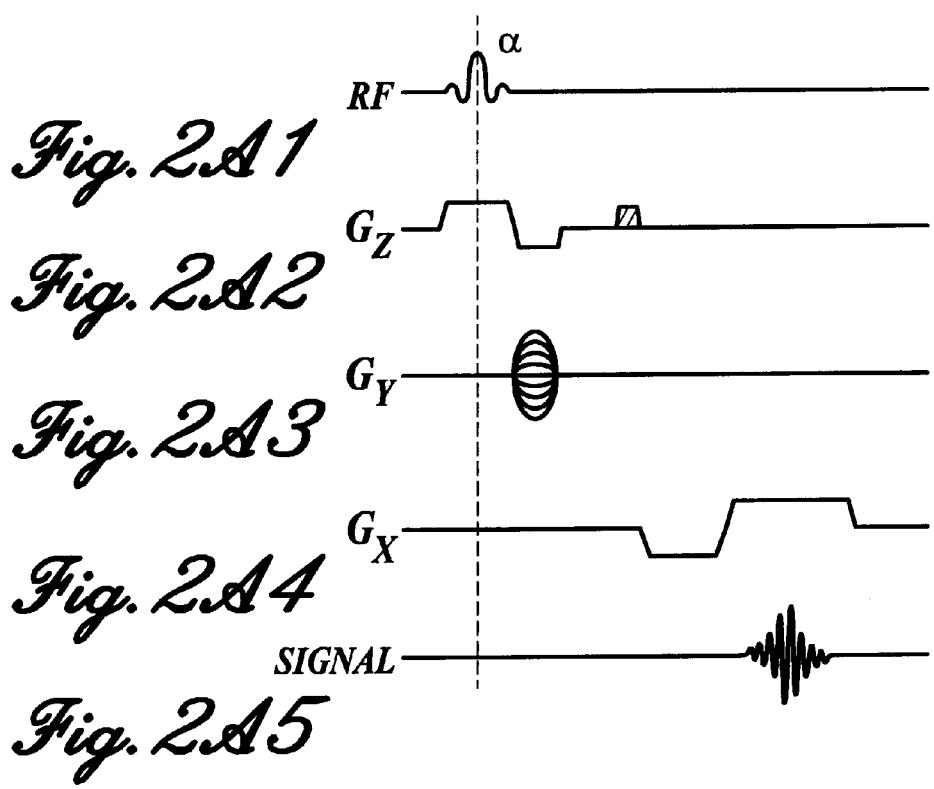
Fig. 2A1
Fig. 2A2
Fig. 2A3
Fig. 2A4
Fig. 2A5
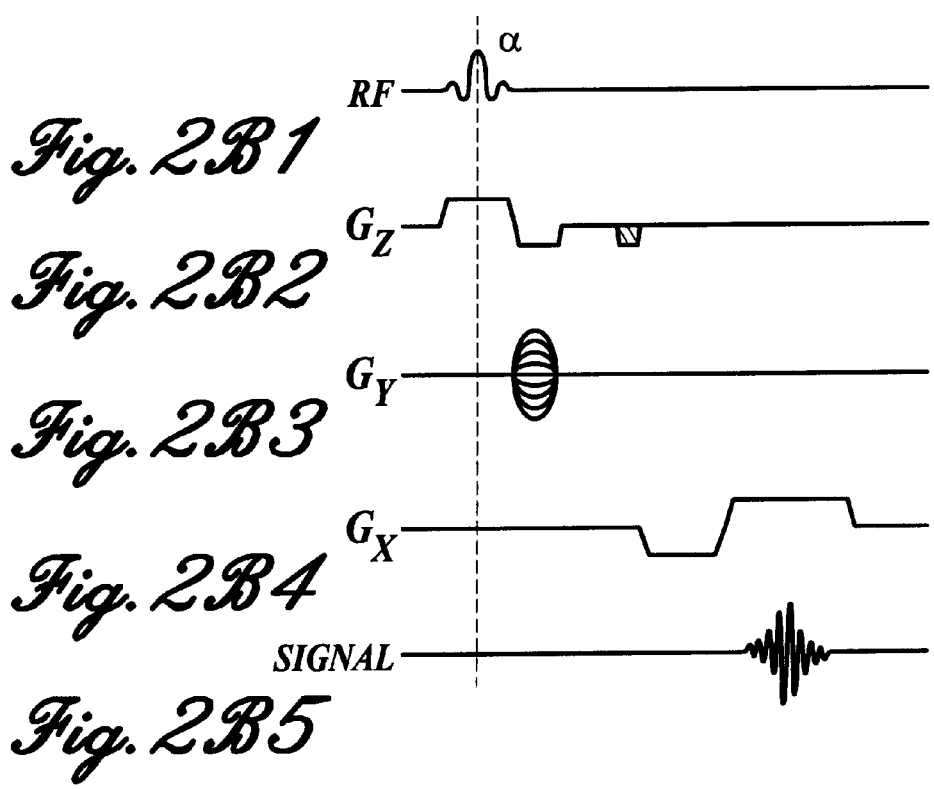
Fig. 2B1
Fig. 2B2
Fig. 2B3
Fig. 2B4
Fig. 2B5

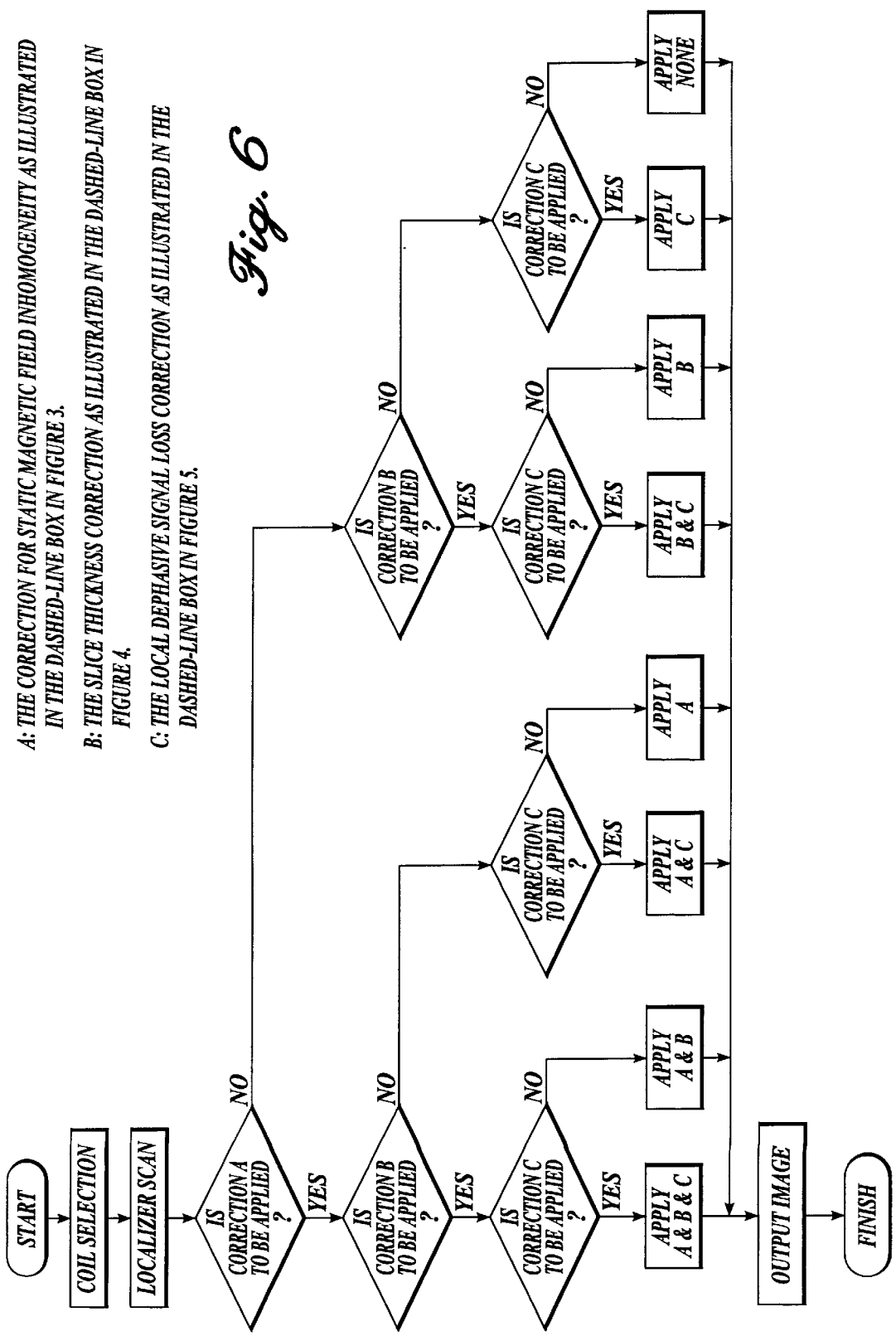

METHOD OF CORRECTING FOR MAGNETIC FIELD INHOMOGENEITY IN MAGNETIC RESONANCE IMAGING

CROSS-REFERENCE TO RELATED APPLICATION

This application claims the benefit of U.S. provisional application Ser. No. 60/043,957, filed Mar. 17, 1997.

FIELD OF THE INVENTION

The present invention relates to magnetic resonance imaging (MRI) methods, and more particularly to a method of correcting for magnetic field inhomogeneity in MRI.

BACKGROUND OF THE INVENTION

Magnetic resonance imaging (MRI) employs three types of magnetic fields, a strong static magnetic field $B_0$ to polarize the sample, a radiofrequency (RF) field $B_1$ for signal excitation, and a vector gradient field $G=(G_x, G_y, G_z)$ for spatial encoding. Medical MRI depends on homogeneous magnetic fields in order to produce anatomically correct and medically useful images. In the presence of implanted metal devices, however, all three magnetic fields are distorted, resulting in images with serious artifacts. The metal devices causing image distortions include orthopedic hardware, joint replacements, and surgical staples. Other imaging modalities, such as CT, ultrasound, and radiography, are also impaired by artifact from the metal and do not allow adequate visualization of soft tissue structures. The magnetic fields may also be distorted by nonmetallic frames used in surgical planning. The frames are needed for accurate coordinate determination for a surgery, and any geometrical distortion, or "warping", of the magnetic resonance (MR) images due to intrinsic sensitivity of MRI to magnetic field inhomogeneity must be corrected. Furthermore, interfaces between dissimilar substances may also cause magnetic field distortions due to discontinuity in magnetic susceptibility. For example, air/tissue interfaces in the lungs often cause distortion of MR images. Thus, at present, it is often impossible to obtain clinically useful MR images from anatomic areas near implanted metal and nonmetallic devices or air/tissue interfaces. There are many clinical circumstances, however, in which the structures adjacent a distortion-causing factor, such as metal, need to be evaluated. These circumstances include monitoring joint replacement complications, evaluating the spine/nerve roots after spinal instrumentation, and monitoring possible tumor recurrence after bone resection and reconstruction. Thus, a need exists for a method of correcting for magnetic field inhomogeneity in MRI that produces MR images of a medically reliable quality.

BRIEF DESCRIPTION OF THE PRESENT INVENTION

The present invention provides a novel method of correcting magnetic field inhomogeneity caused by various factors, such as implanted metal and nonmetallic devices and air/tissue interfaces. The method treats distortions caused by inhomogeneity in all three magnetic fields involved in MRI: a static magnetic field $B_0$ to polarize the sample, an RF field $B_1$ for signal excitation, and a vector gradient fieldg $G=(G_x, G_y, G_z)$ for spatial encoding. First, the method corrects for geometric distortion due to inhomogeneity in the static magnetic field $B_0$ by modifying the magnetic field gradients that are used during the imaging pulse sequence. Specifically, the method adds to a standard pulse sequence a compensation gradient waveform that is applied in the slice selection direction (Z), has a timing substantially identical to the standard frequency encoding gradient ($G_x$), and has an amplitude identical to the slice selection gradient ($G_z$) that is applied during the initial RF excitation. Second, the method corrects for inhomogeneity in the RF field $B_1$ by utilizing an RF coil that is large enough in size, as compared with a metal implant, to make the volumetric percentage of the metal in the coil insignificant. Third, the method corrects for inhomogeneity in the gradient field $G=(G_x, G_y, G_z)$ by treating the most significant error factor, ($G_z$), by a novel method of slice thickness error correction. Specifically, the method acquires two images using two pulse sequences that are identical to each other except that their slice selection gradients are opposite. Since the slice thickness errors in the two images are complementary to each other, the method combines the two images to successfully cancel the effect of the slice thickness error. Lastly, the method includes treatment of local dephasive MRI signal loss, due to magnetic field inhomogeneity, by acquiring two images with positive and negative offset $G_z$ gradient lobes, respectively. The pair of images are combined to cancel the effect of local signal loss error.

BRIEF DESCRIPTION OF THE DRAWINGS

The foregoing aspects and many of the attendant advantages of this invention will become more readily appreciated by reference to the following detailed description, when taken in conjunction with the accompanying drawings, wherein:

FIG. 1A is a standard spin-echo pulse sequence that includes the compensation gradient waveform of the present invention, shown as shaded areas, for correcting geometric distortion due to static magnetic field inhomogeneity;

FIG. 1B is a standard spin-echo pulse sequence that is identical to FIG. 1A except that the slice selection gradient $G_z$ is reversed; FIGS. 1A and 1B are jointly used for the slice thickness error correction of the present invention;

FIGS. 2A and 2B are gradient-echo pulse sequences that include positive and negative offset $G_z$ gradient lobes, respectively, shown as shaded areas, for correcting a local dephasive signal loss;

FIG. 6 is a flowchart illustrating the application of the method of the invention to correct for inhomogeneity in an RF field, a magnetic field, and a gradient field, and a local dephasive MRI signal loss.

DETAILED DESCRIPTION OF THE PREFERRED EMBODIMENT

Figure 3:
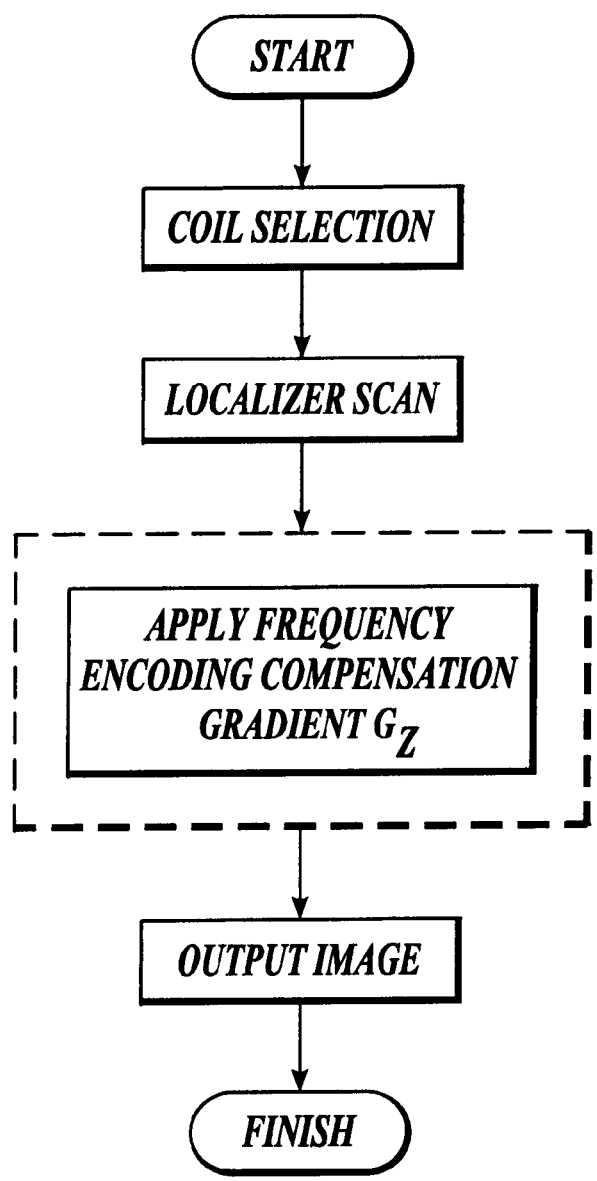
FIG. 3 is a flowchart illustrating the application of the method of the invention to correct for an RF field inhomogeneity and for a static magnetic field inhomogeneity.

The present invention treats all three distortions caused by inhomogeneity in a static magnetic field $B_0$, an RF field $B_1$, and a vector gradient field $G=(G_x, G_y, G_z)$, respectively, by using a novel compensation and optimization process. Though the following description mainly describes a method for correcting magnetic field inhomogeneity caused by metal, it should be understood that the same method is also effective in correcting for magnetic field inhomogeneity caused by other factors, such as nonmetallic material or air/tissue interfaces.

(A) Correction for distortion of the static magnetic field $B_0$.

The magnetic susceptibility of metals is much different from that of tissue, and causes an induced local magnetic field error $\Delta B_0$. This field error $\Delta B_0$ has two effects on magnetic resonance imaging. First, the slice selected in the imaged object along an X-Y plane is no longer a plane, but is a curved surface with a variable displacement $\Delta Z(=\Delta B_0/G_z)$ in the direction perpendicular to the slice. This is because, due to field inhomogeneity induced by the metal, a linear variation in resonance frequencies is no longer assumed along the Z axis following the application of a slice select gradient $G_z$. The second effect is a displacement $\Delta X(=\Delta B_0/G_x)$ in the frequency encoding direction of the image due to distortion to the resonant frequencies along the X axis when the frequency encoding gradient $G_x$ is applied. This displacement results in geometric distortion or signal intensity mismapping in an obtained image. Both $\Delta Z$ and $\Delta X$ are proportional to the field error $\Delta B_0$ and, thus, $\Delta Z$ can be used to cancel out the other, without calculating the actual induced field inhomogeneity $\Delta B_0$. In other words, by tilting the view angle proportionally to the vector strengths of $G_z$ and $G_x$, the frequency shifts along the X axis are corrected. The view angle is independent of susceptibility effects that occur simultaneously along the Z and X directions when both gradients are applied. The mathematical principle of the view tilting technique was first introduced by Z. H. Cho, et al. in "Total inhomogeneity correction including chemical shifts and susceptibility by view angle tilting", *Med. Phys.* 15, 7–11 (1988). The present invention achieves this effect by adding a compensation gradient waveform to any standard pulse sequence known in the art, such as the spin-echo, gradient-echo, fast-spin-echo, or echo-planar-imaging sequence, as more fully described below.

FIG. 1A illustrates one exemplary use of the compensation gradient of the invention in a standard spin-echo sequence. Referring to FIG. 1A, a standard spin-echo pulse sequence begins with the transmission of 90° RF pulse. As is known in the art, at the termination of the initial 90° pulse, the magnetic moments of the individual nuclei are precessing around the Z axis within the X-Y plane. Application of a slice selection gradient $G_z$ simultaneously with the RF pulse causes the nuclear spins of a narrow slice in the imaged object along an X-Y plane to be excited into resonance. After the application of the 90° RF pulse, a 180° RF pulse is applied, which has the effect of rephasing the spins to produce a spin echo signal. This spin echo signal is acquired during a readout gradient $G_x$. Also as is known in the art, a frequency encoding gradient $G_x$ is applied after the 90° RF pulse, but before the readout gradient $G_x$, to center the spin echo signal within the readout gradient $G_x$. The above sequences are repeated with different phase encoding gradients $G_y$, as is known in the art, to acquire multiple data sets from which the imaged object may be reconstructed.

As illustrated in FIG. 1A, the compensation gradient of the present invention, shown as shaded areas along the $G_z$ sequence, is applied in the slice selection direction Z. The compensation gradient has a timing simultaneous to the standard frequency encoding or readout gradient $G_x$, and an amplitude identical to the slice selection gradient $G_z$ that is applied during the initial 90° RF excitation.

Addition of the compensation gradient eliminates the displacement $\Delta X$ in the frequency encoding direction, thereby removing the geometric distortion and signal intensity mismapping. The underlying physical principle is the fact that, as long as the same slice selection gradient $G_z$ is turned on, the selectively excited magnetizations will have the same resonant frequency, unless other gradients such as $G_x$ and $G_y$ are applied. Thus, application of $G_x$ and $G_y$ while the compensation gradient is being applied will produce exactly the desired field variation for a nearly perfect spatial encoding.

The displacement in the slice selection direction $\Delta Z$ is not yet corrected. However, it can be minimized by using a maximized $G_z$ for slice selection, as apparent from the equation $\Delta Z = \Delta B_0/G_z$. The sequence is optimized by increasing the gradient strengths along the Z and X axes to minimize susceptibility shifts. The basic idea for optimization is to use as much gradient as possible within the limits of the chosen hardware, to make the field inhomogeneity less dominating. In this respect, the amplitudes of both $G_z$ and $G_x$ are optimized by increasing the bandwidth per pixel, decreasing the field of view, and increasing the image matrix.

The view angle tilting, or oblique gradient ($G_z$ and $G_x$) application, creates an image-blurring effect along the X axis during signal readout, according to the equation: blur=($G_z/G_x$) times slice thickness. This blur can be minimized by using a maximized frequency encoding gradient $G_x$ and a small slice thickness (e.g., 3 mm). A one-dimensional deconvolution along the X axis at the post-processing stage is also effective to deblur the image.

One minor point to note in applying the compensation gradient is that the frequency range of the signal will become slice location dependent. The frequency offset during signal readout must be adjusted accordingly, otherwise multislice images will be relatively shifted in the frequency encoding direction.

The addition of the compensation gradient significantly reduces the artifact created by the metal. The method is easy to apply to any standard pulse sequence, without any significant increase in imaging time. The most significant benefit of this technique is that the actual static field inhomogeneity does not have to be known. This is fortunate because the inhomogeneity created by a metal device is unique for any given point around a metal implant, as the field error $\Delta B_0$ is affected not only by the metal composition but also by its shape and geometry.

(B) Correction for distortion of the RF magnetic field.

Metals have high electrical conductivity that strongly influences the performance of the RF coils. When the RF magnetic field $B_1$ is distorted, the signal detection sensitivity profile is also distorted resulting in artifactual signal intensity variations across the image.

In accordance with the invention, RF coils are chosen so as to minimize RF distortion to a degree that is barely noticeable. In this regard, distortion becomes more significant when smaller coils, such as a knee coil, are used. The use of an RF coil that is large in size as compared with the metal implant will make the volumetric percentage of the metal in the coil insignificant and, thus, minimizes artifacts created by RF field inhomogeneity. For most metal implants used clinically, RF coils designed for head or body imaging are adequately large.

(C) Correction for distortion of the gradient field $G=(G_x, G_y, G_z)$—Slice thickness error correction.

All three components of this vector quantity $(G_x, G_y, G_z)$ can be distorted by metal. However, the most noticeable artifact in an image is due to the distortion of the slice selection gradient $G_z$. The present invention provides a method of compensating for this effect, which involves reducing slice thickness error.

Because the variable field error $\Delta B_0$ changes spatially, there is a corresponding error in the gradient field. When a gradient error $\Delta G$ is added in the slice selection gradient $G_z$, the slice thickness will become $d=\Delta\omega/\gamma(G_z+\Delta G)$ instead of the nominal $d_0=\Delta\omega/\gamma G_z$ where $\Delta\omega$ is the RF bandwidth of the excitation pulse and $\gamma$ is the gyromagnetic ratio relating the Larmor frequency of the sample to the magnetic field. This gives rise to an image intensity variation near the metal, due to variation in slice thickness d. The invention corrects this artifact by acquiring a pair of images, with everything identical except a reversed $G_z$ gradient. That is, the images are the same except that the $G_z$ gradient is applied in the opposite direction.

FIG. 1B illustrates a standard spin-echo pulse sequence that includes a slice selection gradient $G_z$ that is opposite from the one illustrated in FIG. 1A. FIGS. 1A and 1B, thus, illustrate two such pulse sequences that have opposite slice selection gradients. It has been found that the slice profiles in these two acquisitions are complementary in thickness to each other, i.e., when a slice is thicker than normal in one case, it is thinner in the other. This fact suggests the inventive method of correcting for slice thickness error using two image acquisitions with opposite slice selection gradients $G_z$. Specifically, considering a constant gradient error $\Delta G$ in the slice select direction due to $B_0$ field inhomogeneity, the application of the compensation gradient yields two images with different slice thickness as follows:

$$d_1=\Delta\omega/\gamma(G_z+\Delta G) \quad (1)$$

$$d_2=\Delta\omega/\gamma(G_z-\Delta G) \quad (2)$$

From the above two equations, the desired nominal slice thickness $d_0=\Delta\omega/\gamma G_z$ can be solved as:

$$d_0=2d_1d_2/(d_1+d_2) \quad (3)$$

A simple pixel-by-pixel processing of the two images obtained according to equation (3) will correct for the distortion of $G_z$, where $d_0$ is the output image, and $d_1$ and $d_2$ are the two originally acquired images. Because image intensity is proportional to the slice thickness, according to the equation (3), the correct image intensity I should be given by:

$$I=2I_1I_2/(I_1+I_2) \quad (4)$$

where $I_1$ and $I_2$ are images obtained with the two pulse sequences in FIGS. 1A and 1B, respectively.

(D) Correction for local dephasive MRI signal loss due to magnetic field inhomogeneity.

Within each voxel, or volume element, in an MR image, nuclear spins may experience slightly different magnetic field strength depending on their local environment, and thus, they process at slightly different angular frequencies. This results in dephasing of spins and signal loss if refocusing RF pulses are not used. The signal loss is most obvious in regions next to tissue boundary where substantial magnetic susceptibility change is expected. Certain type of MRI sequences, such as gradient-echo, asymmetric spin-echo, and echo-planar image sequences are particularly sensitive to this dephasive signal loss, for example, in functional MRI when the local magnetic susceptibility change due to blood supply is observed.

The dephasing occurs mostly in the slice selection direction, as the voxel dimension is the greatest in this direction Z, typically being 5 mm as compared to 1 mm in the other two directions (X, Y). To treat the dephasing most effectively, the present method uses positive and negative offset $G_z$ gradient lobes in the slice selection direction Z in a pair of image acquisitions, respectively. The method adds the pair of images to produce a combined image in which the magnetic field inhomogeneity is corrected.

FIGS. 2A and 2B are examples of gradient-echo sequences with the positive and negative offset $G_z$ gradient lobes, shown as the shaded areas. As illustrated in FIGS. 2A and 2B, each offset $G_z$ gradient lobe is applied between the RF excitation pulse and the signal detection pulse. For a pair of images, the positive and negative offset lobes are chosen to have an appropriate duration and amplitude so that each lobe will give a 50% signal reduction in a uniform magnetic field region of the image. Specifically, in a region with signal loss, one image acquired using the positive $G_z$ offset lobe is brighter than normal, while the other image obtained with the negative $G_z$ offset lobe is darker than normal. The two images, though both abnormal, are complementary to each other. Thus, a simple addition of these two images yields a combined image in which the image intensity is very uniform across the entire image. The method, thus, can obtain an image with greatly reduced sensitivity to field inhomogeneity.

To avoid gross motion between the two pulse sequences as illustrated in FIGS. 2A and 2B, the two sequences can be applied in a time-interleaved mode, known in the art as a common data acquisition strategy in MRI.

It should be understood that this method is not limited to an application in a gradient-echo sequence, as illustrated in FIGS. 2A and 2B, but is applicable also in other pulse sequences, such as asymmetric spin-echo, and echo-planar image sequences. Furthermore, the extra offset $G_z$ gradient lobes can be combined with the existing slice selection gradient waveforms to provide more flexibility in timing and amplitude. Since this method uses only the slice gradient $G_z$ as a simple "dephaser/rephaser", it is independent of the geometric distortion and slice thickness correction schemes described above, where the slice selection gradient $G_z$ is used as an additional piece of the frequency encoding gradient.

FIG. 3 is a flowchart illustrating the application of the method of the invention to correct for RF magnetic field inhomogeneity and static magnetic field inhomogeneity. RF magnetic field inhomogeneity is corrected for by an appropriate coil selection, i.e., by choosing a coil large enough to make the volumetric amount of metal in the coil insignificant with respect to the metal in the image. Typically, a localizer scan is first performed to produce relatively low-quality images, as known in the art, to assist the operator of an MRI machine in deciding, for example, whether the machine is functioning normally, whether the patient is properly positioned, where any metal artifacts exist, etc. A high-quality, slower MRI scan is then performed based on the localizer scan image. Static magnetic field inhomogeneity is corrected for by applying a compensation gradient $G_z$ to the MRI scan, as illustrated in a dashed-line box. Finally, an image is output.

Figure 4:
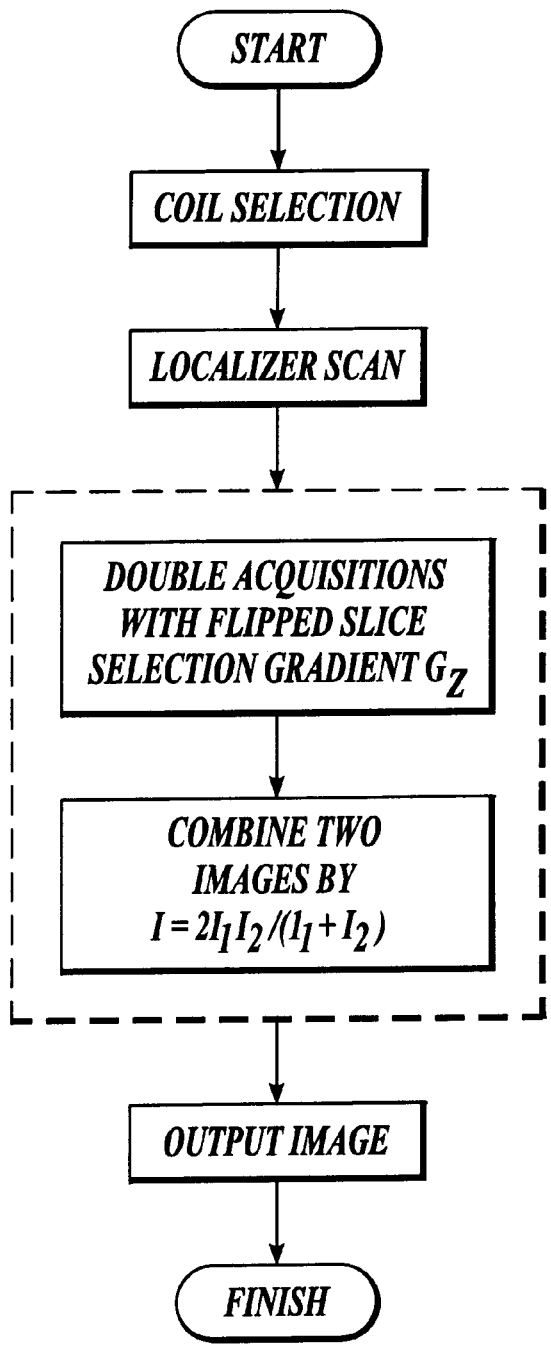
FIG. 4 is a flowchart illustrating the application of the method of the invention to correct for an RF field inhomogeneity and for a gradient field inhomogeneity.

FIG. 4 is a flowchart illustrating the application of the method of the invention to correct for RF magnetic field inhomogeneity and gradient magnetic field inhomogeneity. As in FIG. 3, the RF magnetic field inhomogeneity is corrected for by an appropriate coil selection. A localizer scan is first performed, based on which a high-quality MRI scan is performed. The gradient magnetic field inhomogeneity due to a slice thickness error is corrected for by applying a double acquisition with flipped slice selection gradient $G_z$ to the MRI scan; and combining the resulting two images in accordance with equation (4), as illustrated in a dashed-line box. Finally, the combined image is output.

Figure 5:
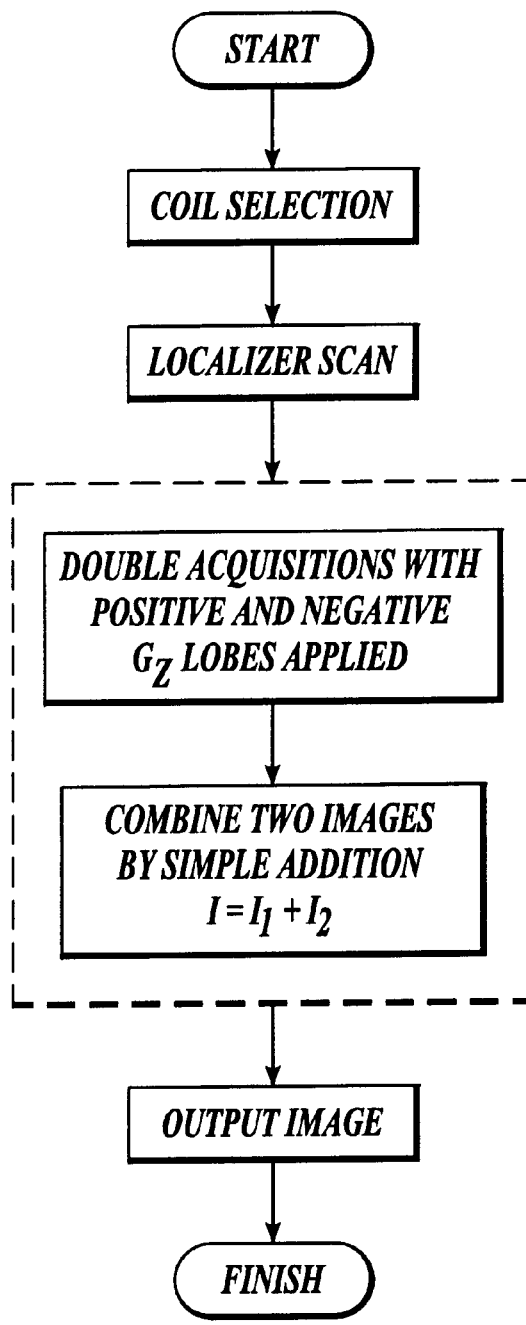
FIG. 5 is a flowchart illustrating the application of the method of the invention to correct for an RF field inhomogeneity and for a local dephasive MRI signal loss due to magnetic field inhomogeneity.

FIG. 5 is a flowchart illustrating the application of the invention to correct for RF magnetic field inhomogeneity and a local dephasive signal loss due to magnetic field inhomogeneity. As in FIGS. 3 and 4, the RF magnetic field inhomogeneity is corrected for by an appropriate selection of the coil. A localizer scan is first performed, based on which a high-quality MRI scan is performed. The local dephasive signal loss due to magnetic field inhomogeneity is corrected for by applying a double acquisition with positive and negative offset $G_z$ lobes to the MRI scan; and combining the resulting two images by simple addition, as illustrated in a dashed-line box. Finally, the combined image is output.

It should be appreciated that all four methods of the present invention to correct for magnetic field inhomogeneity can be used either independently or jointly. FIG. 6 is a flowchart combining all four methods for correcting magnetic field inhomogeneity as described above. In FIG. 6, "A" indicates the method of geometric distortion correction as described above in Section (A), "B" is the method of slice thickness correction as described above in Section (C), and "C" is the method of local dephasive signal loss correction as described above in Section (D). In all cases RF magnetic field inhomogeneity is corrected for, as described in Section (B), by appropriate coil selection, i.e., by selecting a coil large enough to make the volumetric amount of metal in the coil insignificant with respect to the metal in the image.

The method of the present invention greatly improves MR imaging in the presence of metal, and produces markedly improved anatomic visualization around implanted metal devices. The improved image quality allows one to obtain medically important information, which has been unavailable using conventional MR techniques. In addition, the method has no known adverse effects, as the compensation gradients used in the present method cause minimal increase in energy deposition, i.e., heat, in the patient, which is well below the energy deposition limits established for clinical MRI. The method is also effective in correcting for magnetic field inhomogeneity artifacts arising from the air/tissue interfaces, such as in the lungs, and significantly improves image quality and anatomic visualization in their MR imaging. Furthermore, the method is also effective in correcting for magnetic field inhomogeneity caused by nonmetallic frames used for surgical planning to prevent geometric distortion in these MR images.

It should be appreciated that the method described herein can be easily implemented in the form of computer software by those skilled in the art. In this respect, though the present method has been successfully implemented by the inventors on 1.5T General Electric Signa MR System, it should be understood that those skilled in the art can easily implement the functions provided by the present on other General Electric systems, or medical MRI systems available from other vendors.

While the preferred embodiment of the invention has been illustrated and described, it will be appreciated that various changes can be made therein without departing from the spirit and scope of the invention as defined by the appended claims.

The embodiments of the invention in which an exclusive property or privilege is claimed are defined as follows:

1. A method of correcting for geometric distortion due to magnetic field inhomogeneity in magnetic resonance imaging (MRI), the method comprising the steps of:

(a) simultaneously applying an RF pulse sequence and a slice selection gradient Gz pulse sequence;
(b) simultaneously applying a frequency encoding/readout gradient Gx pulse sequence and a compensation gradient pulse sequence, said compensation gradient pulse sequence being applied in the same direction as the slice selection gradient Gz and having substantially the same amplitude as the slice selection gradient Gz that is applied during an initial RF excitation;
(c) detecting magnetic resonance signals during the readout gradient Gx; and
(d) repeating the steps (a) through (c), with the identical pulse sequences, except that both the slice selection gradient Gz and the compensation gradient are applied in the opposite direction.

2. The method of claim 1, further including selecting an RF coil that is sufficiently larger than an object causing magnetic field inhomogeneity, so as to make the volumetric percentage of the metal in the coil insignificant.

3. The method of claim 1, further comprising the step of obtaining a correct image intensity from the two sets of magnetic resonance signals acquired by the two sets of pulse sequences, respectively.

4. A method of reducing slice thickness error to correct for gradient magnetic field inhomogeneity, the method comprising the steps of:

(a) simultaneously applying an RF pulse sequence and a slice selection gradient Gz pulse sequence;
(b) applying a frequency encoding/readout gradient Gz pulse sequence;
(c) detecting magnetic resonance signals during the readout gradient Gx; and
(d) repeating the steps (a) through (c) with identical pulse sequences, except that the slice selection gradient Gz is applied in the opposite direction.

5. The method of claim 4, further including selecting an RF coil that is sufficiently larger than an object causing magnetic field inhomogeneity so as to make the volumetric percentage of the metal in the coil insignificant.

6. A method of correcting for local dephasive magnetic resonance image signal loss due to magnetic field inhomogeneity, the method comprising the steps of:

(a) simultaneously applying an RF pulse sequence and a slice selection gradient $G_z$ pulse sequence, the slice selection gradient $G_z$ sequence including a positive offset gradient $G_z$ lobe to produce approximately 50% signal reduction in a uniform magnetic field region;
(b) applying a frequency encoding/readout gradient $G_x$ pulse sequence;
(c) detecting magnetic resonance signals during the readout gradient $G_x$;
(d) processing the detected magnetic resonance signals to obtain a complex image;
(e) repeating the steps (a) through (d), with identical pulse sequences, except that the slice selection gradient $G_z$ sequence includes a negative offset gradient $G_z$ lobe that has the same amplitude and duration as the positive offset gradient $G_z$ lobe but is applied in the opposite direction from the positive offset gradient $G_z$ lobe; and
(f) combining the two images acquired by the two pulse sequences, respectively.

7. The method of claim 6, further including selecting an RF coil that is sufficiently larger than an object causing magnetic field inhomogeneity so as to make the volumetric percentage of the metal in the coil insignificant.

8. The method of claim 4, further comprising the step of obtaining a correct image intensity from the two sets of magnetic resonance signals acquired by the two sets of pulse sequences, respectively.

9. A method of correcting for geometric distortion due to magnetic field inhomogeneity in magnetic resonance imaging (MRI), the method comprising the steps of:

(a) simultaneously applying an RF pulse sequence and a slice selection gradient Gz pulse sequence to selectively excite magnetizations, wherein the selectively excited magnetizations have a predetermined resonant frequency;

(b) simultaneously applying a compensation gradient Gz pulse sequence and a readout gradient pulse sequence, the compensation gradient Gz pulse sequence being applied in the same direction and having the same amplitude as the slice selection gradient Gz pulse sequence so that the previously selectively excited magnetizations will continue to have the same predetermined resonant frequency; and (c) repeating the steps (a) and (b), with the identical pulse sequences, except that both the slice selection gradient Gz and the compensation gradient Gz are applied in the opposite direction.

10. The method of claim 9, wherein the readout gradient pulse sequence comprises a Gx pulse sequence.

* * * * *

UNITED STATES PATENT AND TRADEMARK OFFICE
CERTIFICATE OF CORRECTION

PATENT NO. : 6,150,815　　　　　　　　　　　　　　　　　　　　　　Page 1 of 1
DATED : November 21, 2000
INVENTOR(S) : D. L. Janzen et al.

It is certified that error appears in the above-identified patent and that said Letters Patent is hereby corrected as shown below:

Title page,
Column 2, item [56],
Refs. Cited (Other Publs., Item 3) *"fifth"* should read --*Fifth* --

Column 1, item [60],
Related U.S. Application Data "Mar. 17," should read -- Apr. 10, --

Signed and Sealed this

Second Day of October, 2001

*Attest:*

NICHOLAS P. GODICI
*Attesting Officer*　　*Acting Director of the United States Patent and Trademark Office*